United States Patent [19]
Masumoto

[11] Patent Number: 5,374,900
[45] Date of Patent: Dec. 20, 1994

[54] PHASE WINDOW TEST CIRCUIT

[75] Inventor: Rodney T. Masumoto, Tustin, Calif.

[73] Assignee: Silicon Systems, Inc., Tustin, Calif.

[21] Appl. No.: 12,325

[22] Filed: Feb. 2, 1993

[51] Int. Cl.⁵ .................... H03L 7/06; G01R 23/00
[52] U.S. Cl. .................... 331/1 A; 331/44; 331/25; 360/51; 324/612; 327/3
[58] Field of Search .................... 331/1 A, 16, 17, 25, 331/44; 360/51; 324/606, 612; 328/133, 134, 137, 155; 307/570, 528

[56] References Cited
U.S. PATENT DOCUMENTS 4,251,740 2/1981 Wilwerding .................... 307/542.1
4,281,259 7/1981 Ozawa .................... 328/133 X Primary Examiner—David Mis
Attorney, Agent, or Firm—Hecker & Harriman

[57] ABSTRACT

The present invention provides a method and an apparatus for controlling and measuring the phase window of a data separator that is suitable for implementation in an automatic test equipment (ATE) system. The test circuit comprising cross-coupled flip-flops uses the pump up (PU) and pump down (PD) signals produced by a phase detector of a phase-locked loop (PLL) to digitally monitor the phase window. The PLL captures a fixed frequency data pattern provided to the data separator and tracks its frequency. The clock inputs of the cross-coupled flip-flops are driven by the pump up and pump down signals output by the phase detector. Once the PLL has captured the fixed frequency data pattern and settled, a single data bit is shifted from its initial position in the center of the phase window. The single data bit is shifted so that its phase leads or lags its initial position. When the single data bit is shifted in the data pattern, the phase detector correspondingly sets PU high, PD high, or both PU and PD high. By shifting the data bit so that its phase is first leading and then lagging, or vice versa, until the flip-flops change state, the edges of the phase window are determined. Due to the digital nature of this test circuit, the phase window of a data separator can be accurately measured by an ATE system.

16 Claims, 7 Drawing Sheets

PHASE WINDOW TEST CIRCUIT

BACKGROUND OF THE INVENTION

1. Field of the Invention

The present invention is related to the field of phase window test circuitry and methods.

2. Background Art

Phase window test circuitry and methods are used to measure the phase window of a data separator utilized in disk drive systems. Data separators are used in data disk systems to separate data signals and clock signals from an analog signal read from the disk media (hereinafter referred to as the read signal). A phase-locked loop (PLL) circuit is implemented in the data separator to produce a clock signal equal in frequency to the data rate of the read signal obtained from the disk media. The PLL circuit acquires the nominal frequency of the read signal and tracks deviations in its nominal frequency, thereby producing an output clock frequency that varies according to deviations of the reference frequency (frequency of the read signal).

In order to track the read signal frequency, the PLL circuit compares the phase of the reference signal to the phase of the PLL output signal. The difference in phase between the two frequencies produces an error signal that drives a voltage controlled oscillator (VCO) of the PLL, thereby forcing the VCO output frequency to follow changes in the reference frequency. The phase "window" of the phase detector defines the range of phase values that the phase detector detects correctly.

PLL circuits implemented in data separators are produced on integrated circuits (IC). Data separator circuits employing phase-locked loops require acquisition circuitry that is well centered within its phase detection window. As a result, a phase window test must be performed on such devices. Automatic test equipment (ATE) is commonly used to test integrated circuits and is generally implemented with digital hardware. However, a need exists for an accurate, digital method of phase window testing suitable for use with ATE systems for testing PLLs implemented in data separators.

FIG. 1 is a block diagram of a PLL 170 of the type embodied in a data separator. The PLL 170 comprises a phase detector 110, charge pump 120, lowpass filter 130 and VCO 140. Reference signal 150 is provided to a first input of phase detector 110. A pump up signal 112 produced at a first output of phase detector 110 is provided to a first input of charge pump 120. A pump down signal 114 produced at a second output of phase detector 110 is provided to a second input of charge pump 120. The output signal 122 of charge pump 120 is coupled to the input of lowpass filter 130. The output voltage signal 132 of lowpass filter 130 is coupled to the input of VCO 140. VCO 140 provides VCO output signal 160 which is feedback coupled to a second input of phase detector 110.

The reference signal 150 has a nominal frequency, $f_{REF}$, that is provided to phase detector 110. The phase detector compares frequency $f_{REF}$ to the frequency $f_{VCO}$ of the VCO output signal 160 provided to the second input of phase detector 110. Phase detector 110 generates one of two signals pump up signal 112 or pump down signal 114, indicating the difference in phase between reference signal 150 and VCO output signal 160. Initially, the frequency $f_{VCO}$ of VCO output signal 160 is not equal to the frequency $f_{REF}$ of the reference signal 1150 and the phase detector produces a phase error signal. The phase error signal is applied to charge pump 120 and may be either pump up signal 112 or pump down signal 114. Pump up signal 112 and pump down signal 114 indicate the difference in phase by which reference signal 150 leads or lags the phase of VCO output signal 160, respectively.

Pump up signal 112 and pump down signal 114 are coupled to the inputs of charge pump 120. Charge pump 120 is well-known in the art and is, therefore not shown in greater detail. However, for purposes of completeness, a typical embodiment is considered comprising a p-type FET and an n-type FET having drains coupled in series that provides an output current. Charge pump 120 produces an output current 122 in response to pump up signal 112 and pump down signal 114 generated by phase detector 110. Thus, pump up signal 112 and pump down signal 114 act to provide current pulses for output signal 112 of charge pump 120. This is affected by transferring charge through transistor action in response to the pump up and pump down signals 112–114, respectively.

The output signal 122 of charge pump 120 is provided to lowpass filter 130. Lowpass filter 130 receives output signal 122 of charge pump 120, thereby producing analog output signal 132 that controls VCO 140. The voltage level of output signal 132 sets the frequency $f_{VCO}$ of VCO output signal 160, thereby adjusting the value of frequency $f_{VCO}$. The new value of frequency $f_{VCO}$ of the VCO output signal 160 is applied to the second input of phase detector 110 which further changes the phase error signal produced by phase detector 110. Phase detector 110 generates a train of pulses provided to charge pump 120, producing current pulses output by charge pump 120 and filtered by lowpass filter 130 so that VCO 140 tracks changes in the reference frequency. Thus, the difference in phase of reference signal 150 and VCO output signal 160 is used in the PLL 170 to control the VCO output signal 160 so that frequency $f_{VCO}$ of VCO output signal 160 is equal to frequency $f_{REF}$ of reference signal 150 through feedback action.

Once the frequency $f_{VCO}$ of VCO output signal 160 becomes equal to, or captures, the frequency $f_{REF}$ of reference signal 150, PLL 170 tracks changes in frequency of reference signal 150 producing an equal frequency for VCO output signal 160 over a range of frequencies referred to as the lock range. The lock range is the range of phase values for the difference in phase between reference signal 150 and locked VCO output signal 160 that produces an appropriate voltage level at the output of lowpass filter 130, thereby forcing frequency $f_{VCO}$ of VCO output signal 160 to track frequency $f_{REF}$ of reference signal 150.

A first prior art method for measuring the phase window of PLL 170 shown in FIG. 1 is an analog method. In this technique, a fixed frequency data pattern (hereinafter referred to as reference signal 150) is applied to the input of PLL 170 while the analog voltage signal 132 output on the pins of the lowpass filter 130 in PLL 170 is monitored. The PLL 170 captures fixed frequency reference signal 150 and tracks its frequency $f_{REF}$. Once PLL 170 has captured fixed frequency reference signal 150 and settled, a single data bit in the fixed frequency reference signal 150 is shifted from its initial position in the center of the phase window. The single data bit is shifted so that its phase leads or lags its initial position. As the selected data bit is shifted to lead or lag in phase, the analog voltage on the pins of lowpass filter 130 of PLL 170 changes accordingly. Thus, if the selected bit is shifted so that it is leading its initial position, the analog voltage 132 output by lowpass filter 130 increases. Similarly, if the shifted data bit is lagging in phase, a corresponding decrease in the analog voltage 132 of lowpass filter 130 occurs.

FIG. 2 is a timing diagram for an early bit illustrating reference signal 150, VCO output signal 160, pump up signal 112, pump down signal 114 and analog voltage signal 132 generated by lowpass filter 130. An early bit is a single data bit of the fixed frequency reference signal 150 that is shifted in phase so that it leads its initial position. Dotted lines 224 and 228 denote the period $1/f_{REF}$ of reference signal 150 and ⅓ cell delay 210 is shown. Similarly, dotted lines 224 and 226 denote the period $1/f_{VCO}$ of VCO output signal 160. As shown in FIG. 2, the frequency $f_{VCO}$ of VCO output signal 160 is three times greater than frequency $f_{REF}$ of reference signal 150 in the present example. The duration of ⅓ cell delay 210 of reference signal 150 is equal to one half of the period $1/f_{VCO}$ of VCO output signal 160.

An unshifted data bit 240 shown in FIG. 2 occurs at rising edge 240A of reference signal 150. Dotted line 228 indicates that the rising edge 240A of data bit 240 is exactly in phase with the rising edge 250A of data bit 250 of VCO output signal 160. An early bit is illustrated by data bit 214 which leads its initial position in phase. Initially, data bit 214 of reference signal 150 and data bit 230 of VCO output signal are in phase, so that rising edge 214A of data bit 214 is aligned with rising edge 230A of data bit 230. However, data bit 214 is shifted to have a leading phase with respect to its initial position which is referenced by rising edge 230A of data bit 230. As shown in FIG. 2, the early bit is indicated by rising edge 214A of data bit 214 which leads rising edge 230A of VCO output signal 160.

Phase detector 110 determines the difference in phase between reference signal 150 and VCO output signal 160 by comparing the rising edge, of a pulse during a cycle of reference signal 150 with the rising edge of a pulse during every third cycle of VCO output signal 160. This is illustrated in FIG. 2, for an early bit, by rising edge 214A of reference signal 150 and rising edge 230A of VCO output signal 160. Data bit 214 of reference signal 150 is shifted relative to its initial position so that it is leading in phase. The initial position of data bit 214 corresponds to rising edge 230A of VCO output signal 160. The rising edge 214A of shifted data bit 214 is leading rising edge 230A of VCO output signal 160 by nearly 180 degrees. In response to this phase difference, phase detector 110 produces a corresponding pulse 216 in pump up signal 112 provided to charge pump 120 shown in FIG. 1. Pulse 216 of pump up signal 112 increases the output current 122 of charge pump 120 thereby resulting in an increased, positive voltage for analog voltage signal 132 produced by lowpass filter 130. The analog voltage level 220 of analog voltage signal 132 due to pulse 216 of pump signal 112 is indicated by a solid line.

Analog voltage level 220 of analog voltage signal 132 corresponds to the maximal leading phase of the phase window for phase detector 110. Leading edge 212A (represented by a dashed lined) indicates that data bit 214 is shifted slightly beyond a leading phase of 180 degrees. In response to the leading phase of rising edge 212A of reference signal 150, phase detector generates a pulse 218 in pump down signal 114 that is indicated by a dashed line in FIG. 2. In this case, no pulse is produced on pump up signal 112. Pulse 218 of pump down signal 114 produces an inversion in polarity of analog voltage signal 132 at the output of lowpass filter 130. The negative analog voltage level 222 of analog voltage signal 132 due to pulse 218 of pump down signal 114 is indicated by a corresponding dashed line. Thus, the leading phase of data bit 214 of reference signal 150 corresponding to inverted voltage level 222 of analog voltage signal 132 produced by lowpass filter 130 demarks one edge of the phase window for phase detector 110 of PLL 170.

FIG. 3 is a timing diagram for a late bit illustrating reference signal 150, VCO output signal 160, pump up signal 112, pump down signal 114 and analog voltage signal 132 generated by lowpass filter 130. A late bit is a single data bit of the fixed frequency reference signal 150 that is shifted in phase so that it lags its initial position. Dotted lines 224 and 228 denote the period $1/f_{REF}$ of reference signal 150 and ⅓ cell delay 210 is shown. Similarly, dotted lines 224 and 226 denote the period $1/f_{VCO}$ of VCO output signal 160. As shown in FIG. 3, the frequency $f_{VCO}$ of VCO output signal 160 is three times greater than frequency $f_{REF}$ of reference signal 150 in the present example. The duration of ⅓ cell delay 210 of reference signal 150 is equal to one half of the period $1/f_{VCO}$ of VCO output signal 160.

An unshifted data bit 340 shown in FIG. 3 occurs at rising edge 340A of reference signal 150. Dotted line 228 indicates that the rising edge 340A of data bit 340 is exactly in phase with the rising edge 350A of data bit 350 of VCO output signal 160. A late bit is illustrated by data bit 314 which lags its initial position in phase. Initially, data bit 314 of reference signal 150 and data bit 330 of VCO output signal are in phase, so that rising edge 314A of data bit 314 is aligned with rising edge 330A of data bit 330. However, data bit 314 is shifted to have a lagging phase with respect to its initial position which is referenced by rising edge 330A of data bit 330. As shown in FIG. 3, the late bit is indicated by leading edge 314A of data bit 314 which lags rising edge 330A of VCO output signal 160.

Phase detector 110 compares the difference in phase between reference signal 150 and VCO output signal 160 by monitoring the rising edge of a pulse during a cycle of reference signal 150 with the rising edge of a pulse during every third cycle of VCO output signal 160. This is illustrated in FIG. 3, for a late bit, by rising edge 314A of reference signal 150 and rising edge 330A of VCO output signal 160. Data bit 314 of reference signal 150 is shifted relative to its initial position so that it is lagging in phase. The initial position of data bit 314 corresponds to rising edge 330A of VCO output signal 160. The rising edge 314A of shifted data bit 314 is lagging rising edge 330A of VCO output signal 160 by nearly 180 degrees. In response to this phase difference, phase detector 110 produces a corresponding pulse 316 in pump down signal 114 provided to charge pump 120 shown in FIG. 1. Pulse 316 of pump up signal 112 decreases the output current 122 of charge pump 120, thereby resulting in a negative voltage for analog voltage signal 132 produced by lowpass filter 130. The analog voltage level 320 of analog voltage signal 132 due to pulse 316 of pump signal 112 is indicated by a solid line.

Analog voltage level 320 of analog voltage signal 132 corresponds to the maximal lagging phase of the phase window for phase detector 110. Lagging edge 312A (represented by a dashed lined) indicates that data bit 314 is shifted slightly beyond a lagging phase of 180 degrees. In response to the lagging phase of rising edge 312A of reference signal 150, phase detector generates a pulse 318 in pump up signal 112 that is indicated by a dashed line in FIG. 3, while no pulse is produced on pump down signal 114. Pulse 318 of pump up signal 112 produces an inversion in polarity of analog voltage signal 132 at the output of lowpass filter 130, The inverted analog voltage level 322 of analog voltage signal 132 due to pulse 318 of pump up signal 112 is indicated by a corresponding dashed line. Thus, the lagging phase of data bit 314 of reference signal 150 corresponding to inverted voltage level 322 of analog voltage signal 132 produced by lowpass filter 130 demarks the second edge of the phase window for phase detector 110 of PLL 170.

If the selected data bit 214 (314) is shifted past-the edges of the phase window as shown in FIGS. 2 and 3, the polarity of analog voltage signal 132 of lowpass filter 130 is inverted. The polarity change marks the upper and lower edges of the phase window and the phase window is measured in this manner. However, this prior art method has the disadvantage that it is not easily implemented in ATE systems since it is an analog method. As stated above, ATE systems are inherently digital systems and, therefore are not suitable for implementation with such an analog method.

A second prior art method for testing the phase window of a PLL measures the pulse width of the ⅓ cell delay signal at a monitor pin. Since the ⅓ cell delay is the primary defining element of the phase window circuit, measuring its pulse width provides an indication of the phase window accuracy. This method can be implemented with ATE systems due to its digital nature. However, there are two disadvantages to this prior art method. First, the monitor point is difficult to measure accurately at high data rates. The high data rate of the read signal (i.e., 48 Megabits/sec) provided to the data separator produces very narrow pulse widths that are difficult to measure. Also, capacitive loading at the monitor point due measurement equipment produces skewed pulses that further distort such measurements. Finally, delays inherent in the data separator circuitry further produce asymmetries in the measured data pulses.

Thus, a need exists for a digital method of accurately testing the phase window of a phase detector employed in a phase-docked loops that can be implemented in ATE systems.

SUMMARY OF THE PRESENT INVENTION

The present invention provides a method and an apparatus for controlling and accurately measuring the phase window of a data separator that is suitable for implementation in an automatic test equipment (ATE) system. The present invention uses the pump up (PU) and pump down (PD) signals produced by the phase detector and provided to a charge pump which correspond to leading and lagging phase differences between the reference frequency and frequency of the output signal of the voltage controlled oscillator (VCO)to digitally monitor the phase window.

The test method comprises a circuit having cross-coupled flip-flops that provides digital detection of the phase window. The clock inputs of the flip-flops are driven by the pump up and pump down signals output by the phase detector of the phase-locked loop (PLL). During normal PLL operation, the flip-flops are kept reset. However, when the phase window is to be tested, the flip-flops are activated. A data separator input pattern having a fixed frequency is provided to the data separator. The PLL captures the fixed frequency data pattern and tracks its frequency. Once the PLL has captured the fixed frequency data pattern and settled, a single data bit is shifted from its initial position in the center of the phase window. The single data bit is shifted so that its phase leads or lags its initial position.

Immediately prior to the application of the shifted data bit, the reset signal is removed from the flip-flops of the test circuit. When the single data bit is shifted in the data pattern, the phase detector correspondingly sets PU high, PD high, or both PU and PD high. If either PU or PD individually goes high first, then the output of the associated flip-flop is set high and the output of the other flip-flop is held low. The output states of the flip-flops are held until the reset signal is again applied to the flip-flops. If both PU and PD are set high together, the outputs of both flip-flops are set high.

When the data bit is centered in the phase window, both flip-flops are set high. As the data bit is shifted, one of the flip-flops continues to be set high while the other flip-flop is set low. When the shifted pulse reaches the edge of the phase window, the flip-flop states are reversed. By shifting the data bit so that its phase is first leading and then lagging, or vice versa, until the flip-flops change state, the edges of the phase window are determined. Due to the digital nature of this test circuit, the phase window of a data separator can be accurately measured by an ATE system.

DETAILED DESCRIPTION OF THE PRESENT INVENTION

A method and apparatus for controlling and accurately measuring the phase window of a phase detector employed in a phase-locked loop that is suitable for implementation in an automatic test equipment (ATE) system is described. In the following description, numerous specific details, such as number and nature of external signals, etc., are described in detail in order to provide a more thorough description of the present invention. It will be apparent, however, to one skilled in the art, that the present invention may be practiced without these specific details. In other instances, well-known features have not been described in detail so as not to unnecessarily obscure the present invention.

Figure 4:
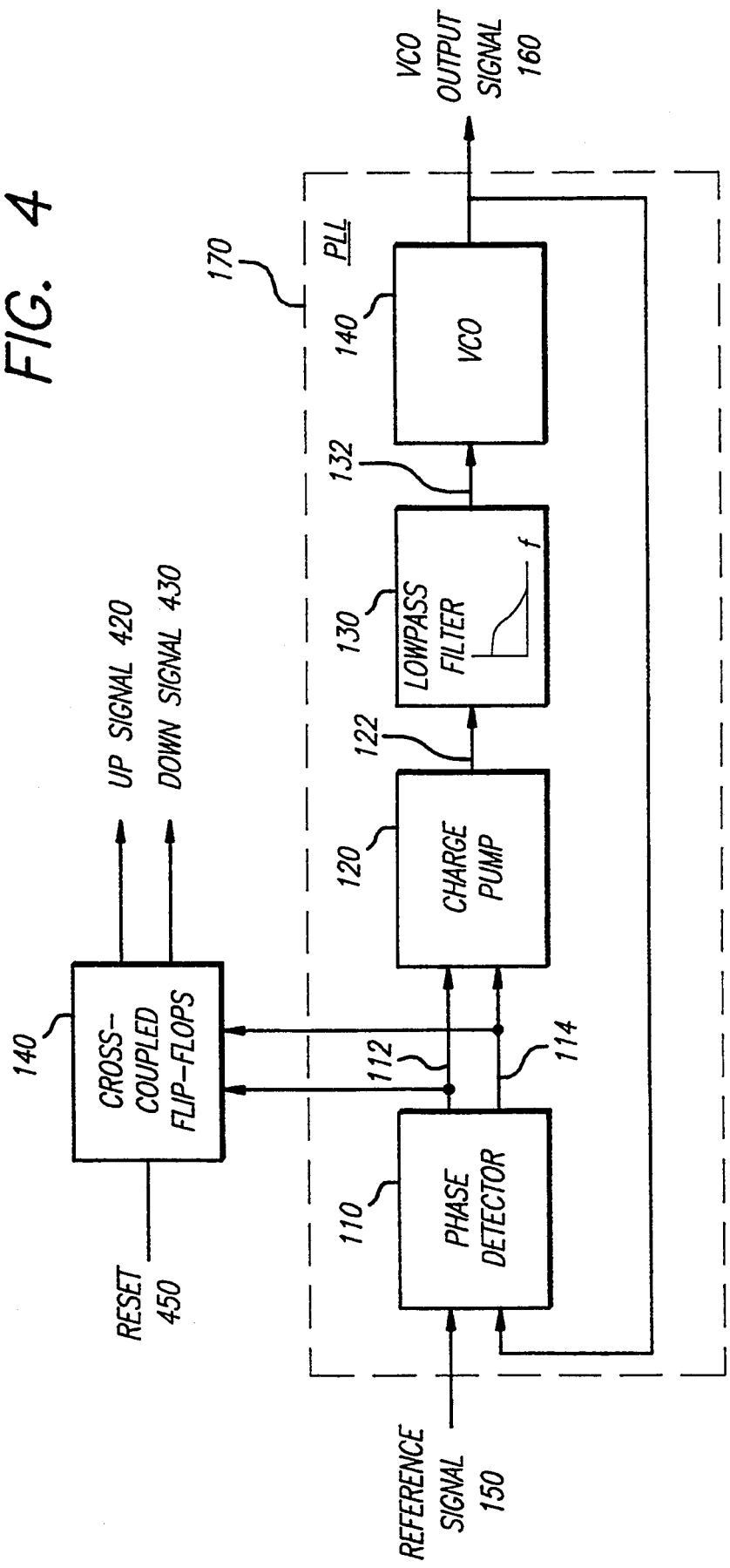
FIG. 4 is a block diagram illustrating the present invention.

FIG. 4 is a block diagram illustrating the present invention comprising PLL 170 and cross-coupled flip-flops 410. Reference signal 150 is provided to a first input of phase detector 110. A pump up signal 112 produced at a first output of phase detector 110 is provided to a first input of charge pump 120 and a first input of cross-coupled flip-flops 410. A pump down signal 114 produced at a second output of phase detector 110 is provided to a second input of charge pump 120 and a second input of cross-coupled flip-flops 410. The output signal 122 of charge pump 120 is coupled to the input of lowpass filter 130. The output voltage signal 132 of lowpass filter 130 is coupled the input of VCO 140. VCO 140 provides VCO output signal 160 which is feedback coupled to a second input of phase detector 110. Reset signal 450 is provided to a third input of cross-coupled flip-flops 410. Cross-coupled flip-flops 410 provide up signal 420 and down signal 430 at the first and second outputs of cross-coupled flip-flops 410.

The circuit illustrated in FIG. 4 accurately measures the phase window of PLL 170 and is suitable for implementation in an ATE system. Cross-coupled flip-flops 410 use pump up and pump down signals 112–114 produced by phase detector 110 and provided to charge pump 120 (corresponding to leading and lagging phase differences between the reference frequency and frequency of VCO output signal 160) to digitally monitor the phase window of phase detector 110 employed in PLL 170.

The clock inputs of the flip-flops are driven by the pump up and pump down signals 112-114 output by phase detector 110. During normal PLL operation, cross-coupled flip-flops 410 are kept reset by reset signal 450. However, when the phase window is to be tested, cross-coupled flip-flops 410 are activated by negating reset signal 450. A fixed frequency reference signal 150 is provided to PLL 170. The PLL 170 captures the fixed frequency reference signal 150 and tracks it. Once PLL 170 has captured reference signal 150 and settled, a single data bit of reference signal 150 is shifted from its initial position in the center of the phase window. The single data bit of reference signal 150 is shifted so that its phase leads or lags its initial position.

Immediately prior to the application of the shifted data bit, reset signal 450 is removed from cross-coupled flip-flops 410. When the single data bit is shifted in reference signal 150 with respect to VCO output signal 160, phase detector 110 correspondingly sets pump up signal 112 high, pump down signal 114 high, or both pump up signal 112 and pump down signal 114 high. If either pump up signal 112 or pump down signal 114 individually goes high first, then up signal 420 or down signal 430 output by cross-coupled flip-flops 410 is set high and the other signal 420 or 430 is held low. The output states of cross-coupled flip-flops are held until reset signal 450 is again applied to cross-coupled flip-flops 410. If both pump up signal 112 and pump down signal 114 are set high together, both up signal 420 and down signal 430 produced by cross-coupled flip-flops 410 are set high. If the next data bit also causes pump up signal 420 and pump down signal 430 to be set high together, both pump up signal 420 and pump down signal 430 produced by cross-coupled flip-flops 410 are set low.

When the data bit is centered in the phase window, both outputs of cross-coupled flip-flops 410 are alternately set high or low together. As the data bit is shifted, one of the outputs of cross-coupled flip-flops 410 corresponding to up signal 420 or down signal 430 continues to be set high while the other signal 420 or 430 is set low. When the shifted pulse reaches the edge of the phase window of phase detector 110, the output states of cross-coupled flip-flops 410 are reversed. By shifting the data bit so that its phase is first leading and then lagging, or vice versa, until cross-coupled flip-flops 410 change state, the edges of the phase window are determined. Due to the digital nature of the circuit shown in FIG. 4, the phase window of phase detector 110 employed in PLL 170 can be accurately measured using an ATE system.

Figure 5:
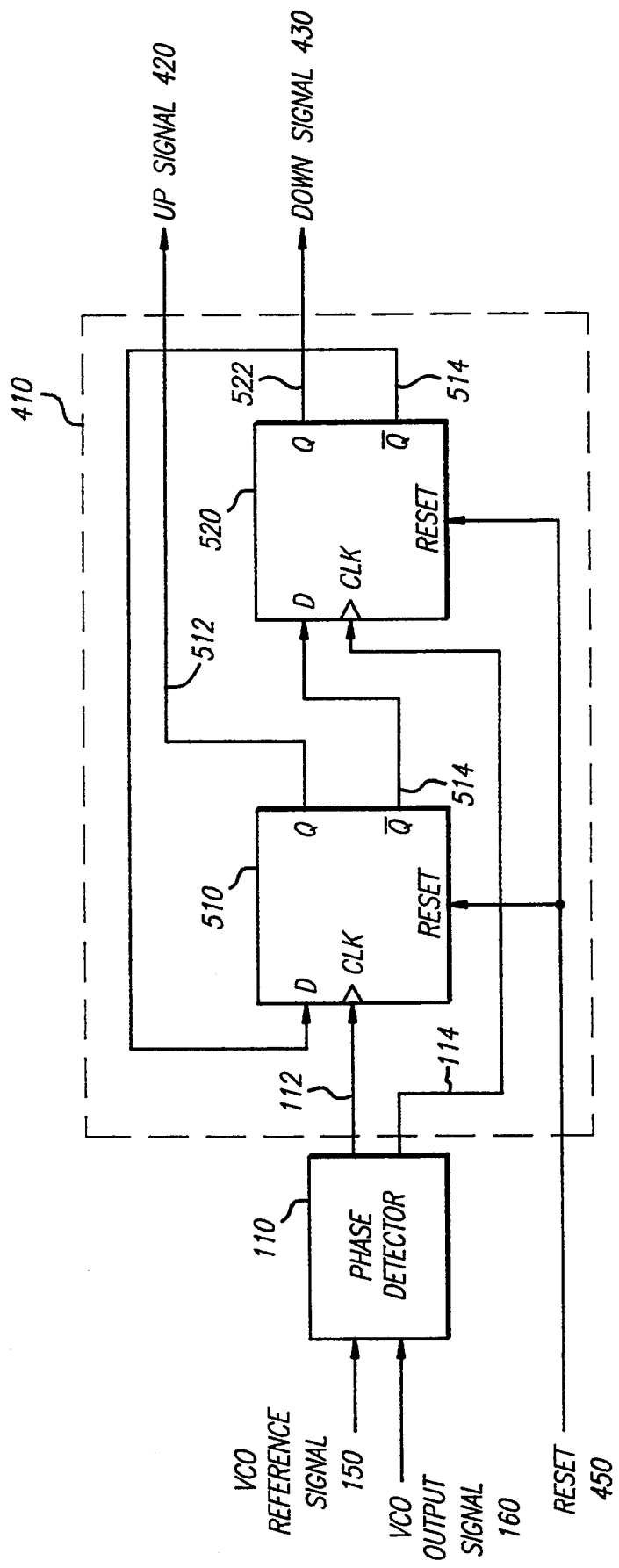
FIG. 5 is a diagram of the present invention for testing the phase window of a phase detector employed in a phase-locked loop.

FIG. 5 is a diagram illustrating the phase window test circuit of the present invention comprising phase detector 110 and D flip-flops 510 and 520. Reference signal 150 and VCO output signal 160 are provided to a first input and second input of phase detector 110, respectively. Pump up signal 112 and pump down signal 114 of phase detector 110 are coupled to the CLK inputs of D flip-flops 510 and 520, respectively. Reset signal 550 is provided to the Reset inputs of D flip-flops 510 and 520. The Q outputs 512 and 522 of D flip-flops 510 and 520 provide up signal 420 and down signal 430, respectively. The $\bar{Q}$ output 514 of D flip-flop 510 is coupled to the D input of D flip-flop 520. The $\bar{Q}$ output 524 of D flip-flop 520 is coupled to the D input of D flip-flop 510. Pump up signal 112 and pump down signal 114 of phase detector 110 are coupled to the first and second inputs of charge pump 120 as shown in FIG. 4.

FIG. 5 illustrates a pair of cross-coupled D flip-flops 510 and 520 that provide a method for digitally detecting the phase window of phase detector 110. Pump up signal 112 and pump down signal 114 of phase detector 110 are the clock inputs of D flip-flops 510 and 520, respectively. During normal operation of PLL 170 shown in FIG. 4, reset signal 450 is asserted, thereby maintaining flip-flops 510 and 520 in a reset state. The phase window of phase detector 110 is tested by negating reset signal 450, thereby activating flip-flops 510 and 520.

Figure 1:
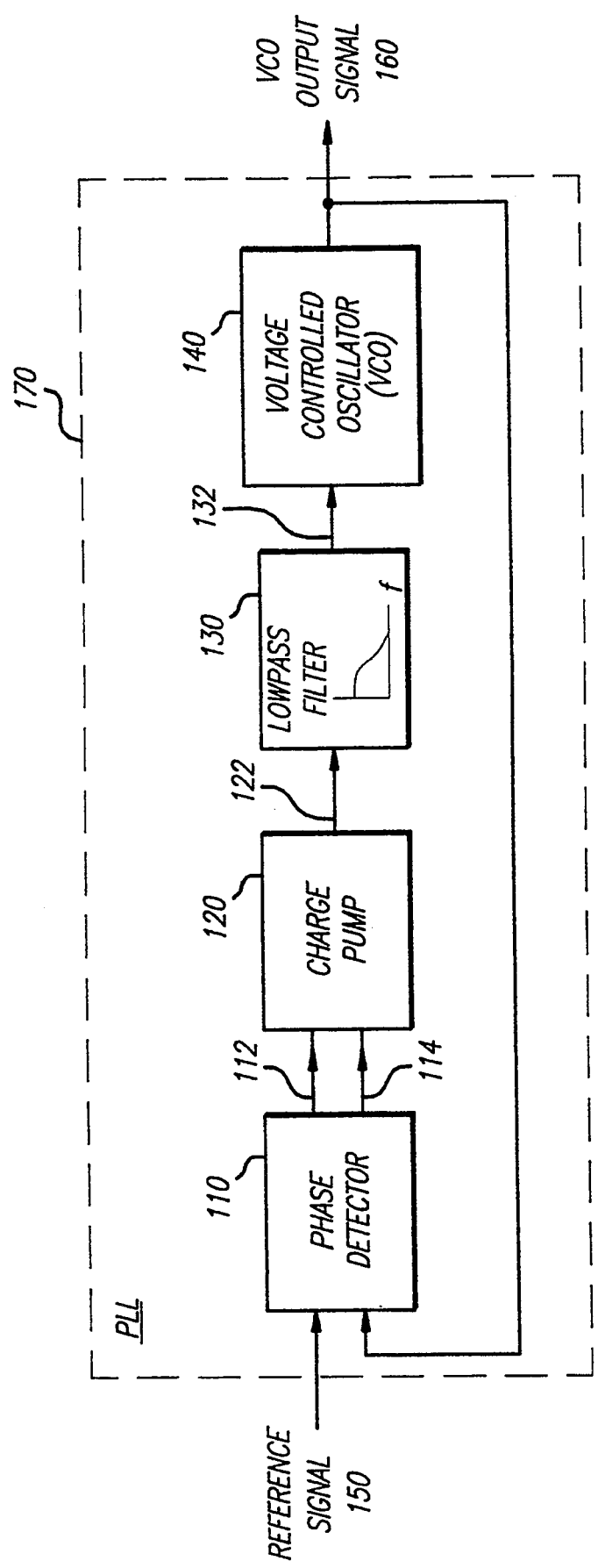
FIG. 1 is a detailed diagram of a phase-locked loop of the type commonly embodied in a data separator.
Figure 2:
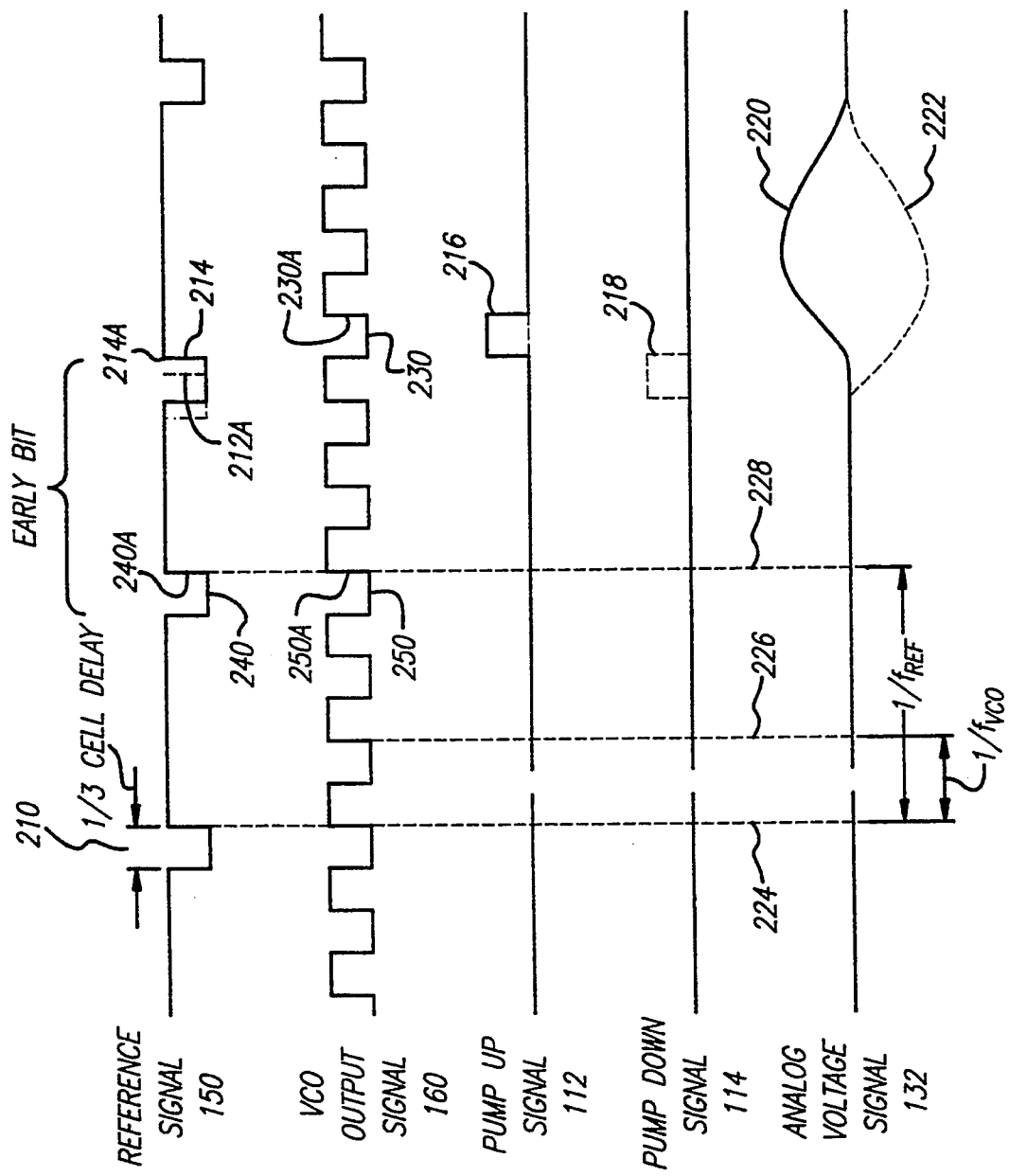
FIG. 2 is a prior art timing diagram for an early bit illustrating reference signal 150, VCO output signal 160, pump up signal 112, pump down signal 114 and analog voltage signal 132 of lowpass filter 130 illustrated in FIG. 1.
Figure 6:
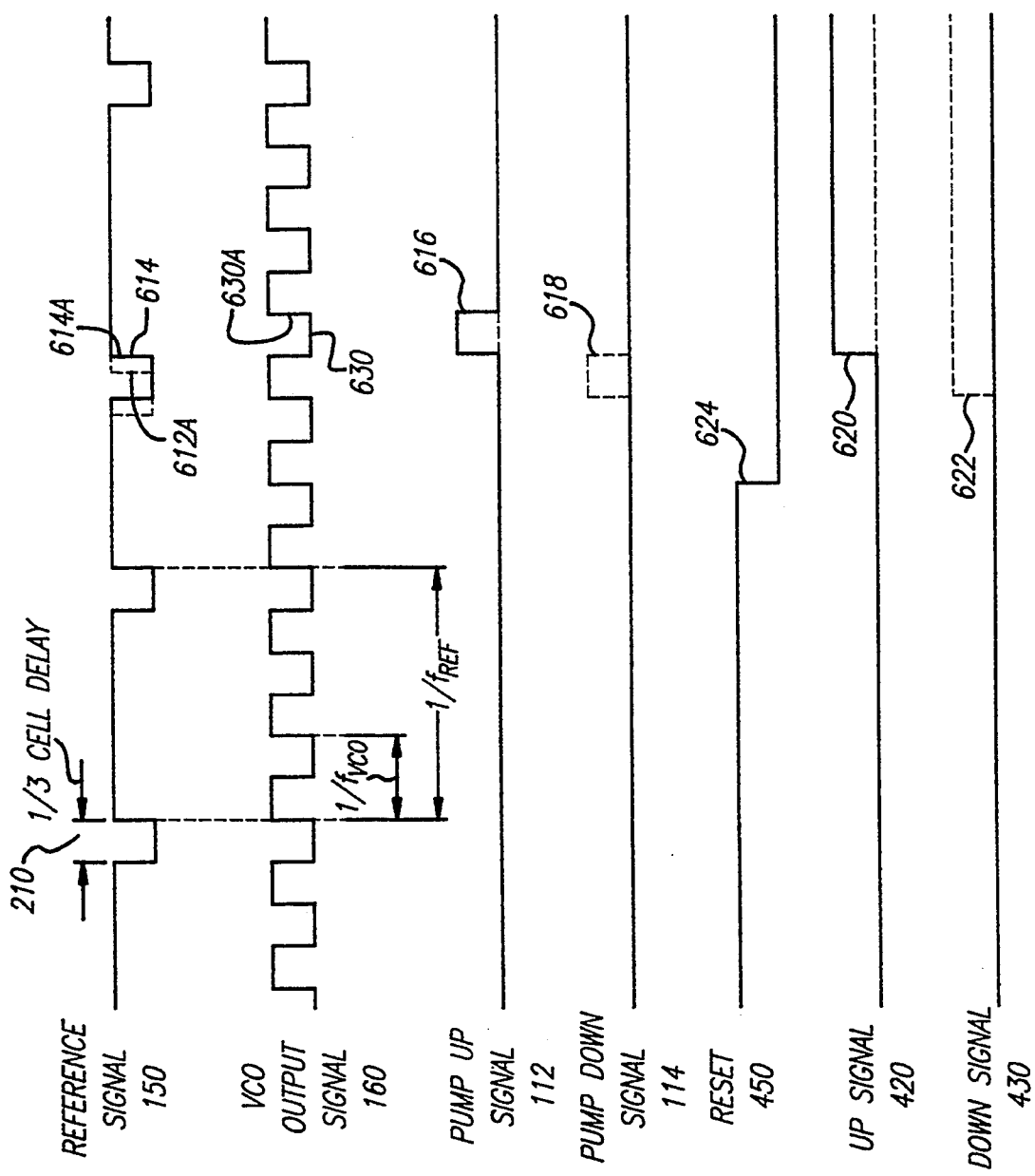
FIG. 6 is a timing diagram for an early bit, according to the present invention, illustrating reference signal 150, VCO output signal 160, puma up signal 112, pump down signal 114, up signal 420 and down signal 430.

FIG. 6 is a timing diagram for an early bit (as described in FIG. 2) illustrating reference signal 150, VCO output signal 160, pump up signal 112, pump down signal 114, reset signal 450, up signal 420 and down signal 430. D flip-flops 510 and 520 are maintained in a reset state by reset signal 450. At falling edge 624 of reset signal 450, reset signal 450 makes a transition from a logic high state to a logic low state, thereby activating D flip-flops 510 and 520. Phase detector 110 compares the difference in phase between reference signal 150 and VCO output signal 160 by monitoring the rising edge of a pulse during a cycle of reference signal 150 with the rising edge of a pulse during every third cycle of VCO output signal 160. This is illustrated in FIG. 6, for an early bit, by rising edge 614A of reference signal 150 and rising edge 630A of VCO output signal 160. Data bit 614 of reference signal 150 is shifted relative to its initial position so that it is leading in phase. The initial position corresponds to rising edge 630A of VCO output signal 160 so that it is leading in phase.

The rising edge 614A of shifted data bit 614 is leading rising edge 630A of VCO output signal 160 by nearly 180 degrees. In response to this phase difference, phase detector 110 produces a corresponding pulse 616 in pump up signal 112 provided to charge pump 120 shown in FIG. 4. Pulse 616 of pump up signal 112 provides a clock pulse to the clock input of D flip-flop 510 which sets the output 512 of D flip-flop to a logic high. Q output 512 provides up signal 420 which is set high at transition 620. Down signal 430 remains logic low, therefore D flip-flop 520 is not clocked and Q output 522 of D flip-flop 520 remains in a logic low state. Thus, FIG. 6 indicates that if data bit 614 is increasingly shifted in phase so that it leads its initial position (indicated by transition 630A of VCO output signal 160), up and down signals 420 and 430 remain in logic high and logic low levels, respectively.

In FIG. 6, shifted data bit 614 of reference signal 150 is increased slightly beyond a leading phase of 180 degrees where data bit 614 is represented by a dashed line having a rising edge 612A. In response to the leading phase of rising edge 612A of reference signal 150, phase detector 110 generates a pulse 618 in pump down signal 114 that is indicated by a dashed line, while no pulse is produced on pump up signal 112 (indicated by dotted line). Pulse 618 of pump down signal 114 provides a clock pulse to the clock input of D flip-flop 520 which sets the out-put 522 of D flip-flop to a logic high. The Q output 512 of D flip-flop 510 changes state to a logic low level.

Q output 522 provides down signal 430 which is set high at transition 622. Up signal 420 remains logic low, therefore D flip-flop 510 is not clocked and Q output 512 of D flip-flop 510 is in a logic low level. FIG. 6 indicates that if data bit 614 of reference signal 150 is increasingly shifted in phase so that it exceeds the leading edge of the phase window of phase detector 110, the Q outputs 512 and 522 of D flip-flops 510 and 520 change states. Up signal 420 goes from a logic high level to a logic low level, whereas, down signal 430 goes from a logic low level to a logic high level. Thus, the leading phase of data bit 614 of reference signal 150 corresponding to the change in output states of D flip-flop 510 from a logic high to a logic low and D flip-flop 520 from a logic low to a logic high demarks a first edge of the phase window for phase detector 110 of PLL 170.

Figure 3:
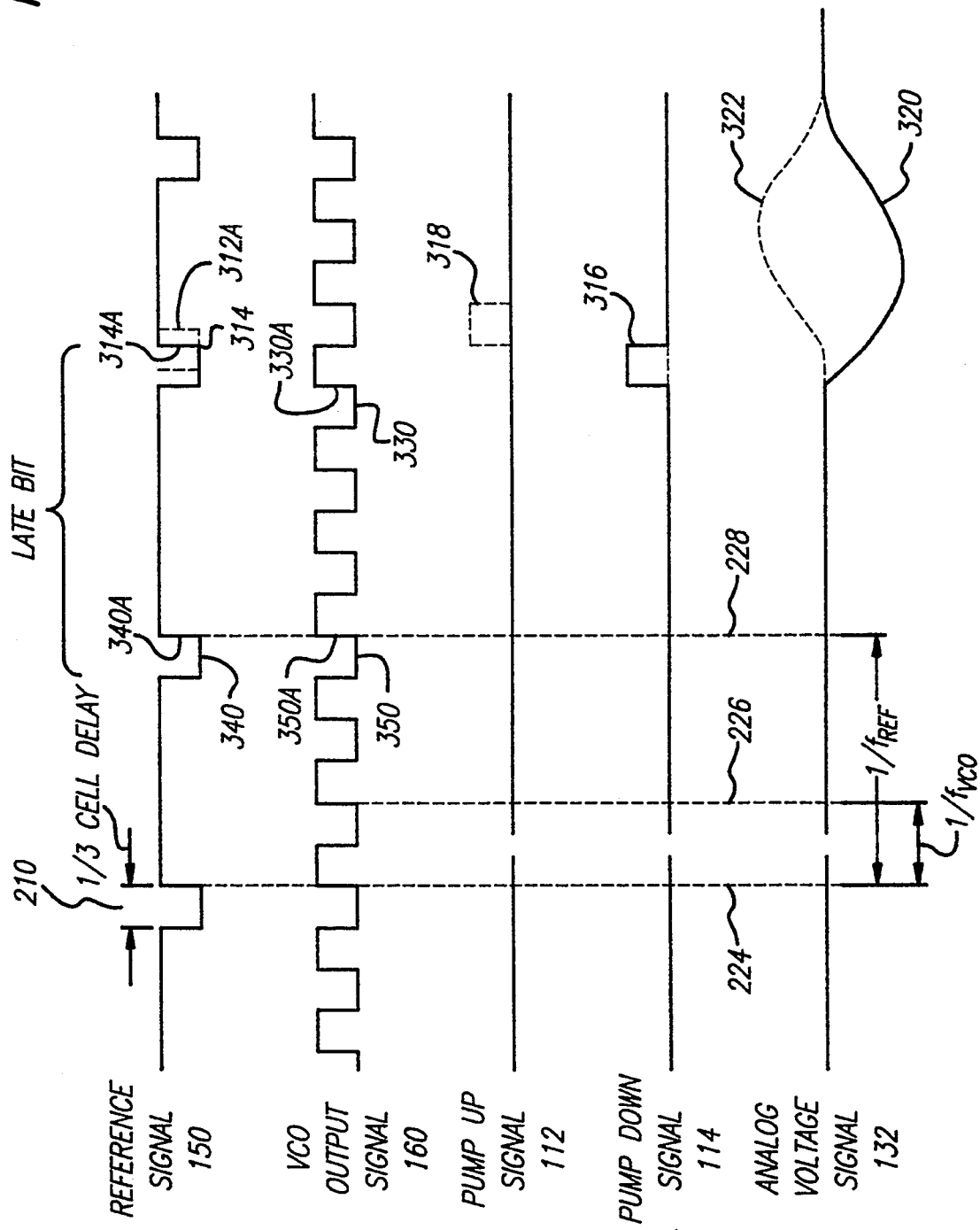
FIG. 3 is a prior art timing diagram for a late bit illustrating reference signal 150, VCO output signal 160, pump up signal 112, pump down signal 114 and analog voltage signal 132 of lowpass filter 130 illustrated in FIG. 1.
Figure 7:
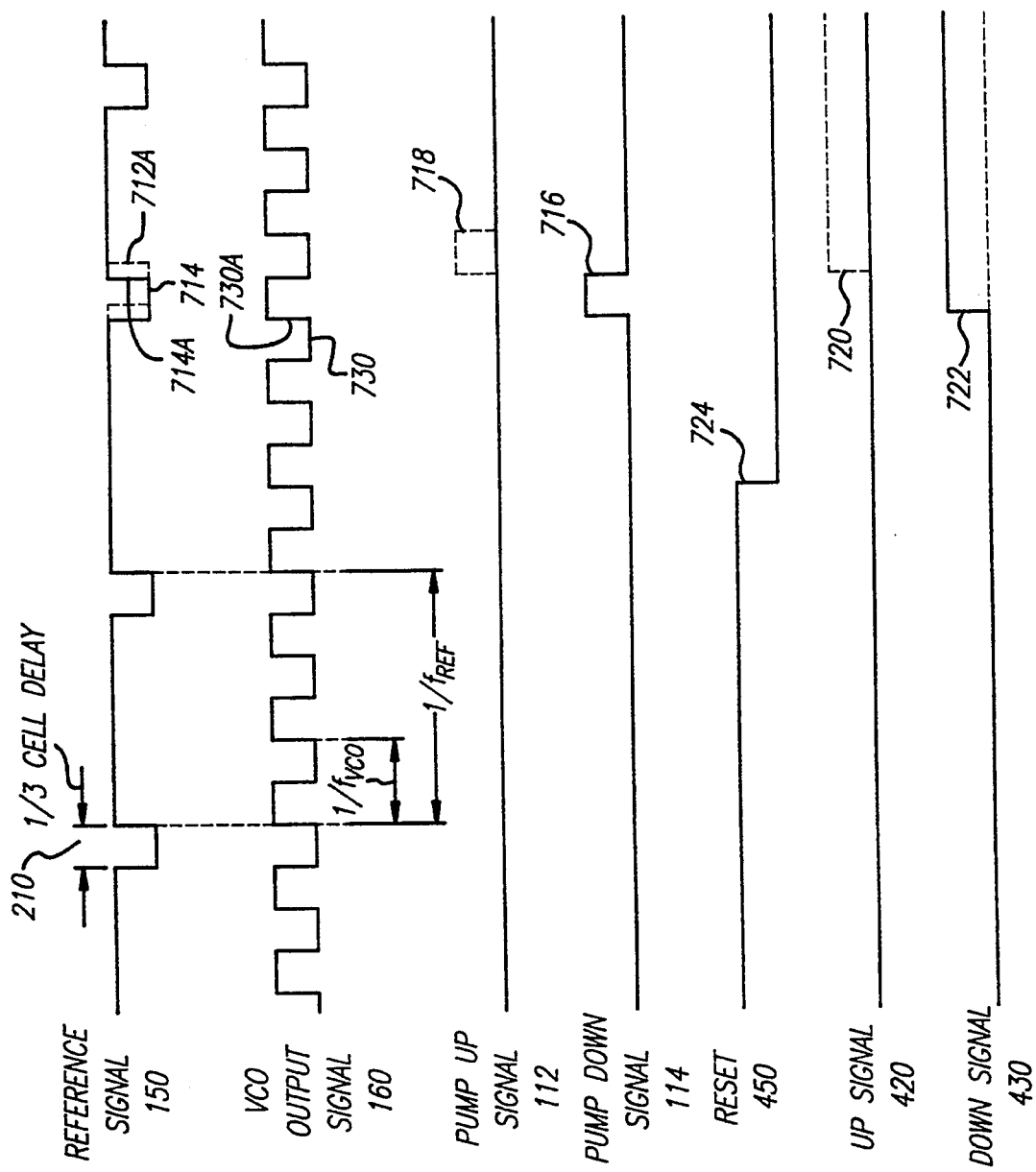
FIG. 7 is a timing diagram for a late bit, according to the present invention, illustrating reference signal 150, VCO output signal 160, pump up signal 112, pump down signal 114, up signal 420 and down signal 430.

FIG. 7 is a timing diagram for a late bit (as described in FIG. 3) illustrating reference signal 150, VCO output signal 160, pump up signal 112, pump down signal 114, reset signal 450, up signal 420 and down signal 430. D flip-flops 510 and 520 are maintained in a reset state by reset signal 450. At falling edge 724 of reset signal 450, reset signal 450 makes a transition from a logic high state to a logic low state, thereby activating D flip-flops 510 and 520. Phase detector 110 compares the difference in phase between reference signal 150 and VCO output signal 160 by monitoring the rising edge of a pulse during a cycle of reference signal 150 with the rising edge of a pulse during every third cycle of VCO output signal 160. This is illustrated in FIG. 7, for a late bit, by rising edge 714A of reference signal 150 and rising edge 730A of VCO output signal 160. Data bit 714 of reference signal 150 is shifted relative to its initial position so that it is lagging in phase. The initial position corresponds to rising edge 730A of VCO output signal 160 so that it is lagging in phase.

The rising edge 714A of shifted data bit 714 is lagging rising edge 730A of VCO output signal 160 by nearly 180 degrees. In response to this phase difference, phase detector 110 produces a corresponding pulse 716 in pump down signal 114 provided to charge pump 120 shown in FIG. 4. Pulse 716 of pump down signal 114 provides a clock pulse to the clock input of D flip-flop 520 which sets the output 522 of D flip-flop to a logic high. Q output 522 provides down signal 430 which is set high at transition 722. Up signal 420 remains logic low, therefore D flip-flop 510 is not clocked and Q output 512 of D flip-flop 510 remains in a logic low state. Thus, FIG. 7 indicates that if data bit 714 is increasingly shifted in phase so that it lags its initial position (indicated by transition 730A of VCO output signal 160), down and up signals 430 and 420 remain in logic high and logic low levels, respectively.

In FIG. 7, shifted data bit 714 of reference signal 150 is increased slightly beyond a lagging phase of 180 degrees where data bit 714 is represented by a dashed line having a rising edge 712A. In response to the lagging phase of rising edge 712A of reference signal 150, phase detector 110 generates a pulse 718 in pump up signal 112 that is indicated by a dashed line, while no pulse is produced on pump down signal 114 (indicated by dashed line). Pulse 718 of pump up signal 112 provides a clock pulse to the clock input of D flip-flop 510 which sets the output 512 of D flip-flop 510 to a logic high. The Q output 522 of D flip-flop 520 changes state to a logic low level.

Q output 512 provides up signal 420 which is set high at transition 720. Down signal 430 remains logic low, therefore D flip-flop 520 is not clocked and Q output 522 of D flip-flop 520 is in a logic low level. FIG. 7 indicates that if data bit 714 of reference signal 150 is increasingly shifted in phase so that it exceeds the leading edge of the phase window of phase detector 110, the Q outputs 512 and 522 of D flip-flops 510 and 520 change states. Down signal 430 goes from a logic high level to a logic low level, whereas, up signal 420 goes from a logic low level to a logic high level. Thus, the lagging phase of data bit 714 of reference signal 150 corresponding to the change in output states of D flip-flop 520 from a logic high to a logic low and D flip-flop 510 from a logic low to a logic high demarks a second edge of the phase window for phase detector 110 of PLL 170.

Referring to FIG. 5, prior to the application of reference 150 to phase detector 110, reset signal 450 is removed from the reset inputs of D flip-flops 510 and 520. When a shifted data bit is input to phase detector 110, phase detector 110 sets pump up signal 112 high, pump down signal 114 high, or both pump up signal 112 and pump down signal 114 high dependent upon whether the data bit is leading, lagging or in phase with its initial position. If either pump up signal 112 or pump down signal 114 goes high first, the corresponding output 512 or 522 of D flip-flop 510 or 520, respectively, is set high and the other flip-flop 510 or 520 is kept low. If both pump up signal 112 and pump down signal 114 are set high simultaneously, both outputs 512 and 522 of flip-flops 510 and 520 are set high.

The outputs 512 and 522 of D flip-flops 510 and 520 provide up signal 420 and down signal 430, respectively, to an ATE system. The state of each D flip-flop 510 and 520 is retained until reset signal 550 is asserted, thereby resetting D flip-flops 510 and 520. The state of D flip-flops 510 and 520 is determined by monitoring the outputs 512 and 522 of D flip-flops 510 and 520 and is particularly suited for implementation using an ATE system. The change in state of flip-flops 510 and 520 mark the upper and lower edges of the phase window and the phase window is measured in this manner.

Thus, a method and an apparatus for controlling and accurately measuring the phase window of a data separator which is suitable for implementation in an automatic test equipment (ATE) system has been described.

I claim:

1. A circuit for measuring the phase window of a phase detector employed in a data separator for a disk drive system comprising:
   a phase detector for determining a difference in phase between a first input signal and a second input signal, said phase detector generating a first and second phase error signal in response to said difference in phase;
   cross-coupled flip-flops coupled to said phase detector, said cross-coupled flip-flops for determining that said first and second phase error signals are asserted; and
   said cross-coupled flip-flops storing signal values representing a first state when said difference in phase is within a phase edge of a phase window, said cross-coupled flip-flops storing signal values representing a second state when said difference in phase is outside said phase edge of said phase window.

2. The circuit of claim 1 wherein said first input signal is a data pattern having a fixed frequency.

3. The circuit of claim 2 wherein said second input signal is a VCO output signal having a frequency dependent upon said data pattern.

4. The circuit of claim 1 wherein said cross-coupled flip-flops comprises two D flip-flops.

5. The circuit of claim 1 wherein said difference in phase is generated by shifting a single data bit of said first input signal in phase relative to its initial position.

6. The circuit of claim 5 wherein said cross-coupled flip-flops provide a first and second output signal.

7. The circuit of claim 6 wherein said first output signal is logic high and said second output signal is logic low in response to an early bit, said early bit is said single data bit shifted in phase to lead its initial position, said first and second output signals changing to logic low and high, respectively, when said early bit exceeds a first edge of said phase window.

8. The circuit of claim 6 wherein said first output signal is logic low and said second output signal is logic high in response to a late bit, said late bit is said single data bit shifted in phase to lag its initial position, said first and second output signals changing to logic high and low, respectively, when said late bit exceeds a second edge of said phase window.

9. A method for measuring the phase window of a phase detector employed in a data separator for a disk drive system comprising the steps of:
   determining a phase difference between a first and second input signal using a phase comparing means;
   generating a first and second phase error signal using said phase comparing means in response to said difference in phase, said first and second phase error signals provided to testing logic means;
   determining that said first and second phase error signals are asserted using said testing logic means;
   generating output representing a first state by said testing logic means when said difference in phase is within a phase edge of a phase window; and
   generating output representing a second state by said testing logic means when said difference in phase is outside said phase edge of said phase window.

10. The method of claim 9 wherein said first input signal is a data pattern having a fixed frequency.

11. The method of claim 10 wherein said second input signal is a VCO output signal having a frequency dependent upon said data pattern.

12. The method of claim 9 wherein said testing logic means comprises two D flip-flops.

13. The method of claim 9 wherein said difference in phase is generated by shifting a single data bit of said first input signal in phase relative to its initial position.

14. The method of claim 13 including the step of generating a first and second output signal provided by said testing logic means.

15. The circuit of claim 14 wherein said first output signal is logic high and said second output signal is logic low in response to an early bit, said early bit is said single data bit shifted in phase to lead its initial position, said first and second output signals changing to logic low and high, respectively, when said early bit exceeds a first edge of said phase window.

16. The circuit of claim 14 wherein said first output signal is logic low and said second output signal is logic high in response to a late bit, said late bit is said single data bit shifted in phase to lag its initial position, said first and second output signals changing to logic high and low, respectively, when said late bit exceeds a second edge of said phase window.

* * * * *